United States Patent
Torrico

(10) Patent No.: US 7,389,878 B1
(45) Date of Patent: Jun. 24, 2008

(54) PROTECTIVE ENCLOSURE FOR AN ELECTRONIC DATA STORAGE DEVICE

(76) Inventor: James R. Torrico, 124 E. North Shore Ave., North Fort Myers, FL (US) 33917

( * ) Notice: Subject to any disclaimer, the term of this patent is extended or adjusted under 35 U.S.C. 154(b) by 0 days.

(21) Appl. No.: 11/386,611

(22) Filed: Mar. 22, 2006

(51) Int. Cl.
B65D 85/48 (2006.01)
(52) U.S. Cl. .................... 206/725; 206/39.4; 361/730
(58) Field of Classification Search ............. 206/37–39, 206/39.4, 305, 320, 521, 523, 525, 526, 576, 206/579, 308.1, 592, 722, 724, 725, 701; 211/40, 41.12; 220/528, 810, 827, 830; 235/486; 431/124, 144, 276; 361/728–730, 737
See application file for complete search history.

(56) References Cited

U.S. PATENT DOCUMENTS

| | | | | | |
|---|---|---|---|---|---|
| 3,251,203 | A | * | 5/1966 | Godbe | 431/124 |
| 4,955,480 | A | * | 9/1990 | Sexton | 206/523 |
| 6,305,539 | B1 | * | 10/2001 | Sanders, Jr. | 206/320 |
| 6,467,619 | B1 | * | 10/2002 | Leen et al. | 206/523 |
| 2006/0038023 | A1 | * | 2/2006 | Brewer et al. | 235/486 |
| 2007/0089488 | A1 | * | 4/2007 | McDonough et al. | 73/37 |

* cited by examiner

Primary Examiner—Luan K Bui
(74) Attorney, Agent, or Firm—William E. Noonan

(57) ABSTRACT

A protective enclosure for a portable electronic data storage device includes an outer shell having a base and a lid movable between open and closed conditions relative to the base. An insert is receivable within the shell. The insert has an interior compartment for accommodating the electronic data storage device and an opening formed through an upper end of the insert in communication with the compartment for extending the storage device therethrough.

15 Claims, 4 Drawing Sheets

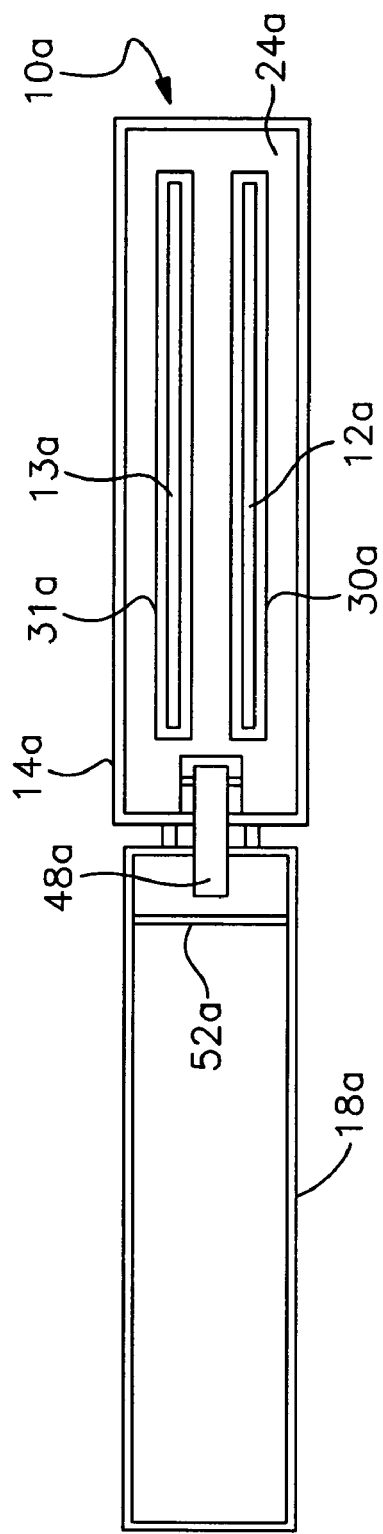
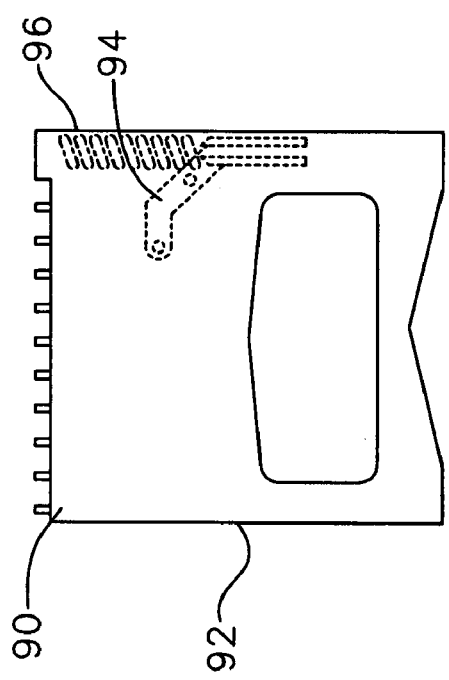

PROTECTIVE ENCLOSURE FOR AN ELECTRONIC DATA STORAGE DEVICE

FIELD OF THE INVENTION

This invention relates to a protective enclosure for an electronic data storage device and, more particularly, to an enclosure that protectively and attractively accommodates various flash memory media including, but not limited to, USB drives, secure digital cards, flash memory sticks and the like.

BACKGROUND OF THE INVENTION

Portable electronic memory and data storages devices known as flash memory are currently utilized in a wide array of products including cellular telephones, computers, digital cameras, modems, audio recorders, printers, portable music players, local area network switches, digital set-up boxes and embedded devices. When such media are transported and handled, they are subjected to wear and damage. Flash memory drives tend to be small and fairly delicate items that can be easily damaged if dropped or mishandled. It is therefore desirable to transport these items in a case or packaging that adequately protects them from damage. Unfortunately, flash memory drives are often carried loosely in the user's pocket. Not only are such devices apt to be damaged, they are also subjected to dust, debris and lint. Such debris can then be transferred by the drive, for example, to a computer's USB receptacle. The present invention relates to a new and unique protective enclosure that is especially suited for accommodating various types of flash memory media and which not only protects these items from damage and debris, but also presents an aesthetically appealing and classically attractive design appearance and feel.

SUMMARY OF THE INVENTION

It is therefore an object of the present invention to provide a rugged and impact resistant protective enclosure for flash media, which protects such electronic devices from damage caused by dropping or mishandling such items during transport.

It is a further object of this invention to provide a protective enclosure for an electronic data storage device that presents a aesthetically attractive and classically appealing design appearance and feel.

It is a further object of this invention to provide a distinctively designed protective enclosure for electronic data storage devices, which is intended to be a conversation piece and collector's item.

It is a further object of this invention to provide a portable electronic data storage assembly that may be formed integrally with various types of flash memory drives such that these items are safely protected from damage and attractively presented.

It is a further object of this invention to provide a protective enclosure for an electronic data storage device that may be either integrated permanently with the storage device or adapted for removably accommodating the device.

It is a further object of this invention to provide a protective enclosure that may be adapted to carry various types, sizes and shapes of flash memory media.

It is a further object of this invention to provide an extremely durable protective enclosure for flash media that is long lasting and usable for a virtually indefinite period of time.

It is a further object of this invention to provide a protective enclosure which prevents dust, lint, debris and other debris from collecting on a flash memory drive during transport and storage, and which also prevents debris from being transferred to the receptacle of electronic equipment utilizing the drive.

This invention results from a realization that a rugged, durable, extremely protective and yet aesthetically attractive enclosure may be provided for various types of flash memory drives by encasing the drive in a protective insert that is snugly received in the shell of a conventional Zippo® brand cigarette lighter. The hard outer shell of the lighter provides for improved impact resistance and prevents the flash memory media from being damaged or collecting debris as it is transported and handled. By the same token, the classically attractive look and feel of the conventional Zippo® cigarette lighter shell provides the enclosure with much aesthetic appeal.

This invention features a protective enclosure for a portable electronic data storage device. The enclosure includes an outer shell having a base and a lid movable between open and closed conditions relative to the base. An insert is receivable within the shell. The insert has an interior compartment for accommodating the electronic data storage device. There is an opening formed through an upper end of the insert in communication with the compartment for extending the storage device therethrough.

In a preferred embodiment, the lid is hingedly attached to the base and a retention bracket is attached to an inside wall of the lid. The enclosure may further include a spring biased cam pivotally attached to the insert for interengaging the retention bracket as the lid is opened and closed relative to the base to retain the lid securely in the open and closed conditions respectively. The interior compartment may include a configuration for generally conforming to the shape of the electronic data storage device accommodated therein. The insert may include a pair of opposing shoulders for interengaging complementary shoulders of the electronic data storage device and holding that device lockably or retentively within the compartment.

In certain embodiments, the insert may include multiple interior compartments for accommodating respective electronic data storage devices. In such cases, corresponding openings may be formed through the upper end of the insert in communication with respective compartments for extending the storage devices accommodated in the compartments respectively therethrough.

This invention also features an electronic data storage assembly that includes a portable electronic data storage device in combination with the enclosure set forth above. As used herein, "portable electronic data storage device" should be understood to include any and all types of flash memory media including, but not limited to, USB drives, secure digital cards, flash memory sticks, etc. The type of flash memory or the intended application of the media is not a limitation of this invention.

In certain embodiments, such as when a USB drive is involved, the storage device may be permanently secured within the compartment of the insert. In such cases, the compartment and the storage device preferably include respective shoulders that interengage to permanently hold the storage device within the compartment of the insert.

In still other embodiments, i.e. when a secure digital card is involved, the compartment and the storage device include respective shapes that allow the storage device to be slidably and removably inserted into the compartment of the insert.

The insert itself may be snugly slidable into and out of the shell. Alternatively, the insert may be permanently fastened within the shell.

DETAILED DESCRIPTION OF PREFERRED EMBODIMENTS

Other objects, features and advantages will occur from the following description of a preferred embodiment and the accompanying drawings, in which:

FIG. 4 is a top view of the assembly of FIG. 3, which depicts a pair of secure digital cards accommodated by the enclosure; in each of FIGS. 3 and 4, the lid of the shell is shown in an open condition; and FIG. 5 is a front elevational view of an optional ejector that can be used within an enclosure compartment that holds a secure digital card.

Figure 1:
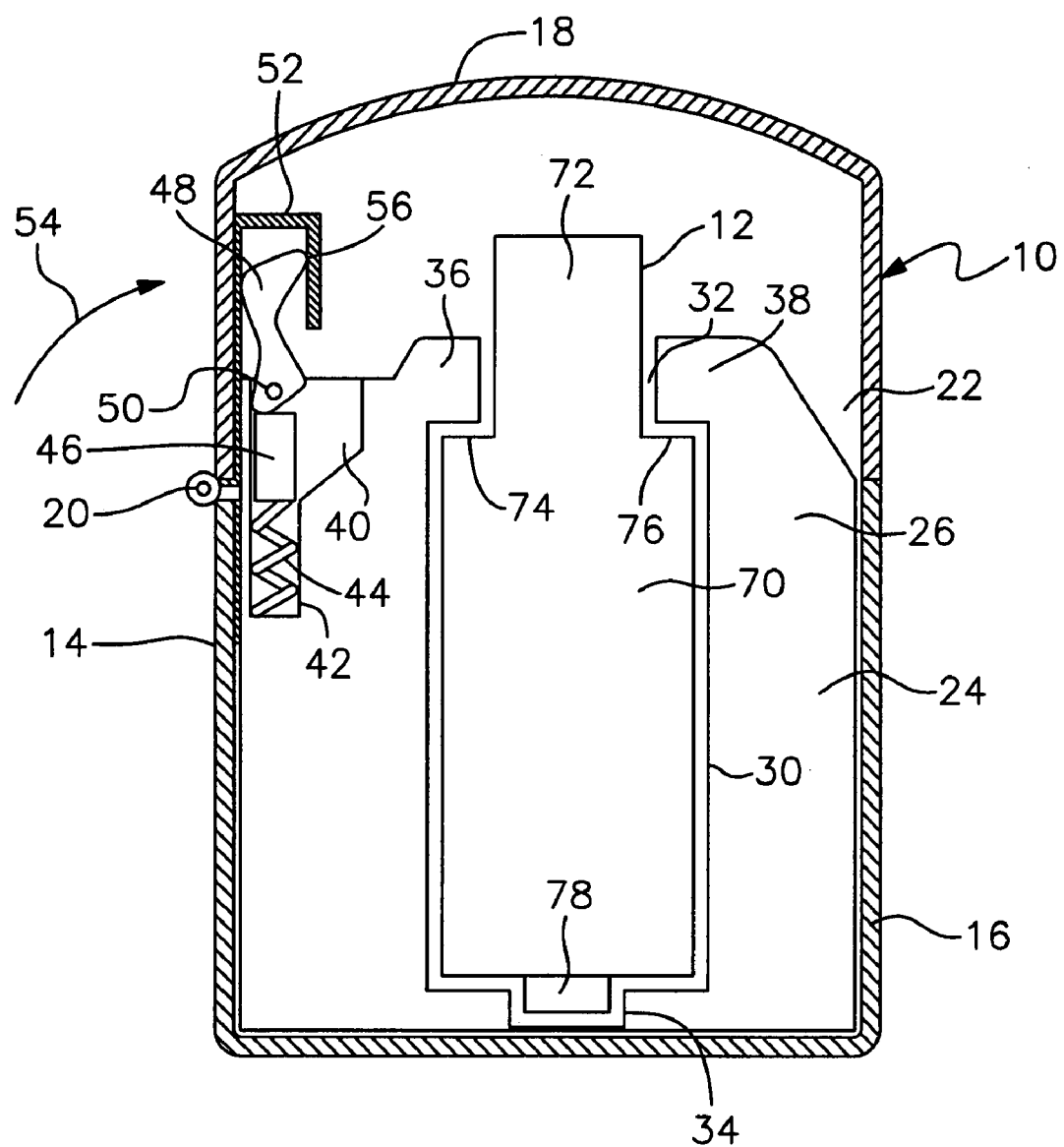
FIG. 1 is a front elevational, cross sectional view of the protective enclosure assembly of this invention wherein a USB storage device is accommodated by the enclosure; the shell of the enclosure is depicted with the lid in a closed condition.
Figure 2:
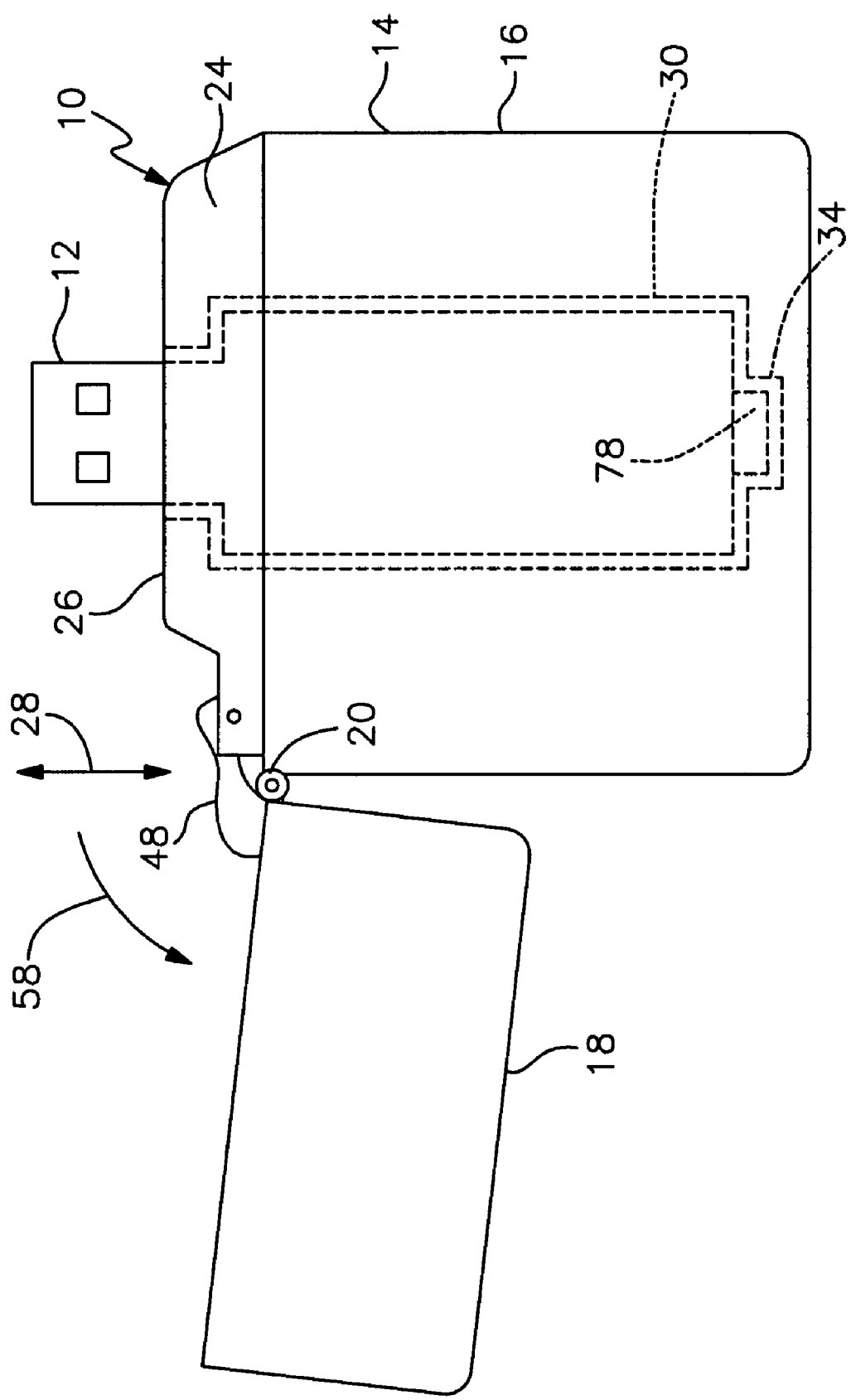
FIG. 2 is a front elevational view of the assembly of FIG. 1 with the lid in an open condition.

There is shown in FIGS. 1 and 2 a protective enclosure 10 for holding a portable electronic memory and data storage device 12. The electronic memory and data storage device comprises a flash memory component and, more particularly in this embodiment, a USB drive. This is a standard storage component that is used in various types of electronic appliances and equipment. The construction of the USB drive will be known to persons skilled in the art and by itself does not comprise a feature of this invention. By the same token, the specific features and function of device 12 are standard and not described herein. However, in certain embodiments, the USB drive or alternative flash memory device may be integrated into the enclosure of this invention as a complete assembly, which assembly is a subject of this invention. It should be understood that the protective enclosure may be used to hold and transport various types of flash memory media including, but not necessarily limited to, USB drives, flash memory sticks, secure digital cards, etc. These components are used conventionally in a wide assortment of appliances, applications and equipment including, but not limited to, computers, digital cameras, cellular telephones, portable music player, printers and the like. The type and intended application of the flash memory device 12 is not a limitation of this invention.

Enclosure 10 particularly includes an outer shell 14 having a lower base 16 and an upper lid 18 that is pivotally attached to an upper end of base 14 by a hinge 20. Preferably, the base, lid and hinge comprise the conventional outer shell of a Zippo® brand cigarette lighter. Such a shell typically includes a rigid metal composition that effectively resists impact and shock. The base and lid, as well as the interconnecting hinge, are standard components of the referenced lighter and are constructed and assembled in a manner that will be known to persons skilled in the art. In alternative embodiments, other rugged constructions and alternative durable materials may be utilized for the shell.

Base 16 and lid 18 include respective interior cavities that define a single interior cavity 22 when shell 14 is closed in the manner shown in FIG. 1. An insert 24 is snugly and conformably received within the cavity of base 16. Insert 24 is composed of a block of durable and relatively rigid material such as Corian® or a high-strength molded plastic. Various alternative insert compositions may be employed. As shown in FIG. 1, the peripheral side and bottom walls of insert 24 generally conform to the interior walls of base 16. As best shown in FIG. 2, the upper portion 26 of insert 24 extends somewhat above the upper edge of base 16 and is exposed when lid 18 is in the opened condition. Insert 24 is snugly receivable within the cavity of base 16 and is slidable into and out of the cavity of the base as indicated by doubleheaded arrow 28 in FIG. 2.

A central compartment 30 is milled, molded or otherwise formed within insert 24. Compartment 30 extends from an opening 32 at the upper end of insert 24 to a reduced diameter recess 34 formed proximate the bottom of the insert. Insert 24 includes a pair of inwardly turned shoulders 36 and 38 that are formed at the upper end of the insert adjacent to opening 32.

Insert 24 also includes a recess 40 for accommodating the lid retention hardware of the enclosure. Recess 40 is again formed by milling, molding or other processes performed during the manufacture of insert 24. The recess includes a relatively wide portion proximate the upper end of the insert and a lower groove 42 that depends from the upper portion. Groove 42 accommodates a helical spring 44 having a plunger 46 attached at the upper end thereof. The plunger engages the lower end of a cam lever 48 that is secured to the insert by a pivot pin 50. The cam lever, spring and plunger retain the hinged lid in either an open or closed condition, as selected. As with the known Zippo® lighter shell, a metal retention bracket 52 is mounted on the interior wall of lid 18. When the lid is closed, as shown in FIG. 1, bracket 52 overlaps and engages cam lever 48 in the manner shown in FIG. 1. As the cam lever pivots about pin 50 in the direction of arrow 54, and into the position of FIG. 1, the lower end of the cam lever is biased by spring 44 and plunger 46 such that distal tip 56 of cam lever 48 bears against retention bracket 52. This frictional interengagement holds the lid in a closed condition and prevents the lid from opening unless and until the user elects to pivotally flip the lid open using finger pressure. When the user elects to open lid 18, as shown in FIG. 2, retention bracket 52, FIG. 1, pulls on the upper end of the lever; this causes cam lever 48 to pivot in the reverse direction, indicated by arrow 58 in FIG. 2. The cam lever 48 slides over the top of plunger 46 and the spring mechanism, comprising spring 42 and plunger 46, holds the cam lever in the position shown in FIG. 2. The upper end of the cam lever (obscured in FIG. 1) thereby bears against the inner wall of lid 18, at least while the lid is being pivoted upwardly. This resists closing of the lid, at least until the user exerts sufficient force on lid 18 to overcome the cam lever and spring resistance such that the lid is closed. This operation is analogous to the closing operation exhibited by the standard Zippo® lighter. A distinctive "click" sounds each time the lid is opened or closed resulting from interengagement of the cam lever with the lid.

Enclosure 10 operates in the foregoing manner to allow lid 18 to be alternated, as required, between the closed position shown in FIG. 1 and the open position shown in FIG. 2. In either case, the spring, plunger and cam lever operate to retain the lid in its selected position until the user elects to change that position (i.e. from closed to open or open to closed). In the closed condition, shown in FIG. 1, the insert and its accommodated flash memory component 12 are fully enclosed within shell 14. With the lid open, FIG. 2, the upper end of insert 24 and the upper end of its accommodated electronic component 12 are exposed.

Flash memory components may be accommodated within insert 24 either permanently or removably. In the embodiment shown in FIGS. 1 and 2, the USB drive 12 is permanently integrated into insert 24 and is not removable therefrom. In particular, as shown in FIG. 1, component 12 includes a main body 70 that is received within and generally conforms to the shape of compartment 30. A narrower upper portion 72 extends upwardly from main body 70 and through upper opening 32 of insert 24. Component 12 includes a pair of shoulders 74, 76 that respectively interengage inwardly turned shoulders 36 and 38 of insert 24. This interengagement between the respective shoulders of the USB drive and the insert locks the flash memory component into the interior compartment of the insert and prevents removal of the USB drive from the insert. The lower end of the flash memory component carries a plastic base 78 that fits into recess 34 of compartment 30.

During transportation, storage and handling, component 12 remains within enclosure 10 with lid 18 closed against base 16. As a result, component 12 is securely and reliably protected against damage from dropping, mishandling, shock, impact or otherwise. The enclosure and, more particularly shell 18, prevents most dust, lint, dirt and other debris from collecting on the flash memory drive. USB drives are commonly subjected to such debris when carried in the user's pocket. Shell 18 remains closed during transport. Debris does not collect in or on the drive and such debris is not transferred to the complementary USB receptacle formed in the computer or other electronic appliance. This helps to keep the equipment in good running condition and reduces contamination and possible malfunctioning of the equipment. At the same time, the protective outer shell 14 presents an aesthetically appealing and classically attractive appearance.

To utilize the USB drive device, the user simply flips open lid 18 in the above described manner and engages the upper end 72 of device 12 with the pertinent electronic equipment. If the physical characteristics of the intended USB receptacle require removal of the insert 24 from shell 18, the upper end 26 of the insert 24 is grasped and the data storage device and insert are slid upwardly and out from the interior cavity of base 16. Component 12 is then engaged with a piece of electrical equipment and utilized in a known manner. When use of the USB drive is no longer needed, the electronic data storage device is disengaged from the receptacle. When applicable, the insert can be returned to the base of the shell by simply inserting the lower end of the insert back into the cavity in the base of the shell and sliding the insert and accommodated flash memory component back into the shell base. Once again, an extremely snug fit is provided between the interior wall of the base and the outer surface wall of the insert. This securely holds the insert and accommodated flash memory media within the shell and prevents them from accidentally slipping out of the shell. By the same token, whenever required, a replacement flash memory component and integral insert may be acquired and installed into the shell in a similar manner. It should be understood that the retention hardware, i.e. the spring, plunger and cam lever are preferably incorporated into and provided with the insert. Alternatively, these components may be re-used when the insert is replaced. After the data storage device is disengaged from the receptacle of the electronic equipment and is snugly accommodated within the insert and base 16 of shell 14, the lid 18 is pivoted shut to fully enclose and protect the data storage device.

In alternative embodiments, the foregoing construction may be modified somewhat. For example, the insert may comprise two separable halves that are opened to install the flash memory component into and remove that component from the compartment of the insert. Nonetheless, a one-piece insert securely and permanently locks a USB drive component having a configuration as shown in FIGS. 1 and 2 into the compartment and thereby more reliably protects that component against mishandling and damage.

Figure 3:
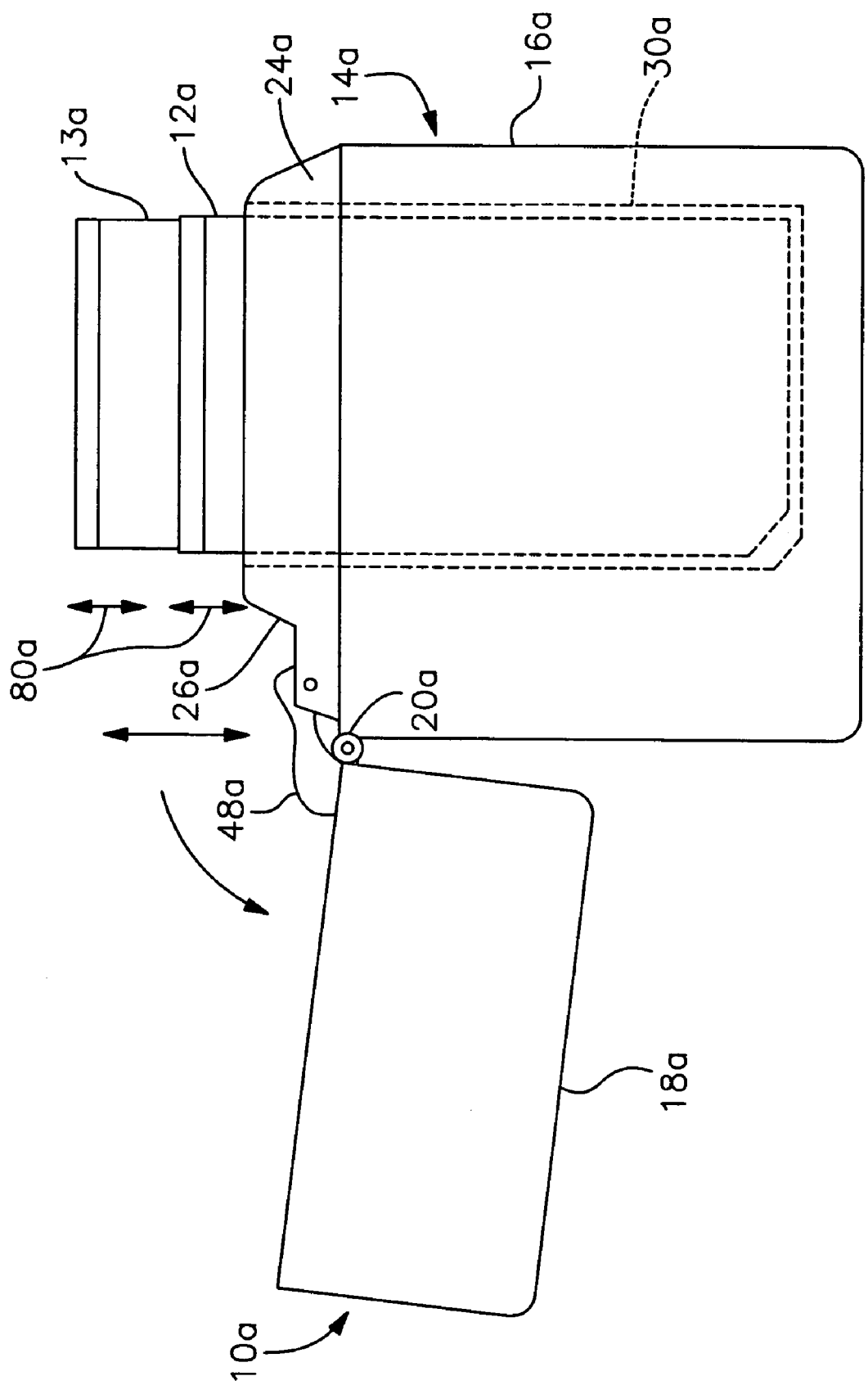
FIG. 3 is a front elevational view of an alternative version of the enclosure assembly wherein a pair of secure digital cards are accommodated by the enclosure.

An alternative protective enclosure 10a for flash memory components is shown in FIGS. 3 and 4. This version is constructed for removably receiving a pair of secure digital (SD) cards 12a and 13a. It should be noted that in alternative embodiments, an enclosure may be provided for accommodating a single card of this type or, alternatively, more than two cards.

Once again, the enclosure includes a protective outer shell 14a, which is preferably identical or at least very similar to shell 14 of the prior embodiment. In particular, the shell includes a lower base 16a and an upper lid 18a that is hingedly attached to base 16a by a hinge or pivot 20a. These components may again comprise a Zippo® brand cigarette lighter or the like.

A molded or milled insert 24a is again snugly, slidably received within the cavity of base 16a. The upper end 26a of insert 24a projects above the upper end of base 16a, at least when lid 18a is in the open condition shown in FIGS. 3 and 4. Insert 24a again carries lid retention hardware, including a cam lever 48a, as well as a spring and plunger (not shown), which are mounted to insert 24a in a manner analogous to that previously described. The lid retention hardware likewise operates in a manner similar to that previously described.

In this version, insert 24a includes two side-by-side slots or compartments 30a, 31a best shown in FIG. 4, for accommodating flash memory media 12a and 13a respectively. As best represented by compartment 30a shown in phantom in FIG. 3, each compartment has a shape that generally conforms to the shape of the secure digital card 12a, 13a that the compartment accommodates. In this version, the flash media and the compartments that hold the media do not include the complementary shoulders shown in the prior embodiment. As a result, the secure digital cards 12a and 13a are slidably inserted into and removed from their respective compartments 30a and 31a, as indicated by doubleheaded arrows 80a in FIG. 3.

Enclosure 10a is employed in a manner analogous to that of the previously described embodiment. In particular, secure digital cards 12a and 13a are slidably and removably received in respective compartments 30a and 31a of insert 24a. Lid 18a is pivotally closed, as needed, to fully enclose and protect the accommodated flash memory cards. When this occurs, lever 48a is flipped upwardly and engaged by retention bracket 52a to hold the lid closed. Alternatively, when use of cards 12a and 13a is required, the user simply flips the lid open such that cam lever 48a pivots to the position shown in FIGS. 3 and 4. The user then accesses one or both cards 12a and 13a and slides them out of their respective slots. The cards may then be installed and used in applicable electronic equipment. Subsequently, the cards may be replaced in their respective compartments and the lid re-closed to again fully enclose and protect the flash memory components. The components may then be transported, stored or handled with virtually no risk of causing damage to those components.

As in the prior embodiment, enclosure 10a provides not only for rugged and reliable protection from impact and debris, it also exhibits an attractive and classically appealing look and feel. The shell of the enclosure exhibits the classic "click" commonly exhibited by the Zippo® lighter due to the use of insert 24 and the spring biased cam lever mounted thereto. The attractive appearance of that item is also provided. The shell and insert are extremely durable and exhibit a virtually indefinite service life. When SD cards, memory sticks and the like are inserted into enclosure 10, the contactors of the drive is double protected from both impact and debris; i.e. the storage component is inserted with its contactors down so that the contactors are enclosed within and guarded by both body 24a and shell 12a.

In still other versions, the cards may be inserted into respective ejectors 90, FIG. 5, that are themselves received in respective compartments 30a, 31a. These ejectors employ structure as used, for example, in the KEL brand secure digital card connector for effectively locking the card within the ejector. Ejector 90 includes a thin casing 92. Each compartment accommodates a respective ejector 90. The ejector lacks the electrical connections employed in the referenced KEL brand connector, but is otherwise conventional and constructed in the same manner. The ejector includes a spring loaded locking mechanism. The secure card is engaged with the ejector by inserting the card into the ejector and pressing it against the spring loaded, j-hook 94 of the ejector to lock the card in place within the ejector housing. Pressing the locked card again downwardly against the j-hook and spring 96 releases the lock of the ejector in a known manner and allows the card to be removed from the ejector and the enclosure. In different versions, the standard spring loaded ejector and locking mechanism may be mounted permanently within the compartment. In such cases, the casing is eliminated.

It should be noted that in alternative embodiments, the insert may be secured permanently by an adhesively or otherwise within the base of the shell. A removable insert is particularly preferable when the flash component is integrated permanently into the insert.

From the foregoing it may be seen that the apparatus of this invention provides for an electronic data storage device and, more particularly, to an enclosure for protectively and attractively accommodating various flash memory including, but not limited to, USB drives, secure digital cards, flash memory sticks and the like. While this detailed description has set forth particularly preferred embodiments of the apparatus of this invention, numerous modifications and variations of the structure of this invention, all within the scope of the invention, will readily occur to those skilled in the art. Accordingly, it is understood that this description is illustrative only of the principles of the invention and is not limitative thereof.

Although specific features of the invention are shown in some of the drawings and not others, this is for convenience only, as each feature may be combined with any and all of the other features in accordance with this invention.

Other embodiments will occur to those skilled in the art and are within the following claims:

What is claimed is:

1. A protective enclosure for a portable electronic data storage device, said enclosure comprising:
   an outer shell having a base and a lid movable between open and closed conditions relative to said base, said lid being hingedly attached to said base;
   an insert receivable within said shell, said insert having an interior compartment for accommodating the electronic data storage device and an opening formed through an upper end of said insert in communication with said compartment for extending the storage device therethrough;
   a retention bracket attached to an inside wall of said lid; and
   a spring biased cam pivotally attached to said insert for interengaging said retention bracket as said lid is opened and closed relative to said base to retain said lid selectively in said open and closed conditions;
   said compartment including an ejector having a spring loaded releasable locking mechanism for releasably holding the storage device within said compartment when the storage device is inserted into said ejector and pressed against said spring loaded releasable locking mechanism, the held storage device being pressed again against said spring loaded releasable locking mechanism to release the storage device for removal thereof from said ejector and said compartment.

2. The enclosure of claim 1 in which said interior compartment includes a configuration for generally conforming to the shape of the electronic data storage device accommodated therein.

3. The enclosure of claim 1 in which said insert includes a pair of opposing shoulders on respective sides of said opening for interengaging the electronic data storage device and holding the device within said compartment.

4. The enclosure of claim 1 in which said insert includes a second interior compartment for accommodating a respective second electronic data storage device and a corresponding second opening said second opening formed through the upper end of said insert in communication with said second compartment for extending the second storage device accommodated in said second compartment therethrough.

5. An electronic data storage assembly comprising:
   a portable electronic data storage device;
   an outer shell having a base and a lid movable between open and closed conditions relative to said base, said lid being hingedly attached to said base;
   an insert receivable within said shell, said insert having an interior compartment for accommodating the electronic data storage device and an opening formed through an upper end of said insert in communication with said compartment for extending the storage device therethrough;
   a retention bracket attached to an inside wall of said lid; and
   a spring biased cam pivotally attached to said insert for interengaging said retention bracket as said lid is opened and closed relative to said base to retain said lid selectively in said open and closed conditions.

6. The assembly of claim 5 in which said compartment has a shape that generally conforms the shape of the electronic data storage device accommodated therein, such that said storage device is retained within said compartment.

7. The assembly of claim 5 in which said storage device is secured permanently within said compartment of said insert.

8. The assembly of claim 5 in which said compartment and said storage device include respective shapes that allow said storage device to be slidably and removably insertable into said compartment.

9. The enclosure of claim 5 in which said insert is removably receivable within said base of said shell.

10. The enclosure of claim 5 in which said insert is snugly and slidably received in said base of said shell.

11. The enclosure of claim 5 in which said electronic data storage device includes a flash memory component.

12. The enclosure of claim 5 in which said flash memory component includes a USB flash drive.

13. The enclosure of claim 12 in which said storage device includes a USB connector portion that extends through said opening and a pair of shoulders that are adjacent to said connector portion and interengaging complementary inwardly turned shoulders on respective sides of said, opening to retain said storage device within said compartment.

14. The enclosure of claim 12 in which said flash memory component includes a secure digital card.

15. The enclosure of claim 5 in which said compartment includes an ejector having a spring loaded releasable locking mechanism for releasably holding said storage device in said compartment when said storage device is inserted into said ejector and pressed against said spring loaded releasable locking mechanism, said held storage device being pressed again against said spring loaded releasable locking mechanism to release said storage device for removal thereof from said ejector and said compartment.

* * * * *